(12) United States Patent
Mito et al.

(10) Patent No.: US 8,789,456 B2
(45) Date of Patent: Jul. 29, 2014

(54) PISTON CYLINDER-TYPE HIGH-PRESSURE GENERATING DEVICE

(75) Inventors: Masaki Mito, Kitakyushu (JP); Masayoshi Hamada, Kitakyushu (JP)

(73) Assignees: Kyushu Institute of Technology, Kitakyushu-shi, Fukuoka (JP); HMD Corporation, Kitakyushu-shi, Fukuoka (JP)

( * ) Notice: Subject to any disclaimer, the term of this patent is extended or adjusted under 35 U.S.C. 154(b) by 767 days.

(21) Appl. No.: 12/994,333

(22) PCT Filed: Apr. 14, 2009

(86) PCT No.: PCT/JP2009/001712
§ 371 (c)(1),
(2), (4) Date: Nov. 23, 2010

(87) PCT Pub. No.: WO2009/150778
PCT Pub. Date: Dec. 17, 2009

(65) Prior Publication Data
US 2011/0094376 A1    Apr. 28, 2011

(30) Foreign Application Priority Data
Jun. 10, 2008 (JP) .................................. 2008-151191

(51) Int. Cl.
*F01B 11/02* (2006.01)

(52) U.S. Cl.
USPC ............... 92/171.1; 73/818; 73/856; 324/248

(58) Field of Classification Search
USPC ........ 92/130 R, 130 B, 169.1, 171.1, 133, 61, 92/DIG. 4; 269/316, 189; 324/261; 73/818, 73/856, 744; 425/77
See application file for complete search history.

(56) References Cited

U.S. PATENT DOCUMENTS 2,705,418 A * 4/1955 Francis et al. .................... 73/38
2,947,608 A * 8/1960 Howard ......................... 423/446
(Continued)

FOREIGN PATENT DOCUMENTS

GB    2438838 A  * 12/2007
JP    64-068496 A    3/1989
(Continued)

OTHER PUBLICATIONS

M. Mito, "Magnetic measurements on molecule-based magnets under high pressure", Journal of the Physical Society of Japan, 76 (2007) Supplement A, pp. 182-185. The reference in English is attached.

*Primary Examiner* — Edward Look
*Assistant Examiner* — Michael Quant
(74) *Attorney, Agent, or Firm* — McGlew And Tuttle, P.C.

(57) ABSTRACT

A cylinder portion is divided into a cylinder main body, and two side cylinders coupled to opposite ends of the cylinder main body. The cylinder main body is configured so that a sample-enclosing capsule in which a sample and a pressure medium are enclosed can be disposed inside the cylinder main body. Pistons for load transmission are disposed at opposite ends of the interior of the cylinder portion; and locking nuts are provided on the outer sides of the positions. The pistons are moved in an axial direction by screwing the locking nuts. With this configuration, a piston cylinder-type high-pressure generating device in which a cylinder having a small outer diameter is formed of a non-magnetic material can generate a high pressure while securing a sample space having a predetermined effective volume.

18 Claims, 4 Drawing Sheets

(56) References Cited

U.S. PATENT DOCUMENTS

| | | | | |
|---|---|---|---|---|
| 3,616,685 | A | * | 11/1971 | Strom .................................. 3/84 |
| 3,934,455 | A | * | 1/1976 | Harrisberger ..................... 436/5 |
| 4,599,891 | A | * | 7/1986 | Brauer et al. ..................... 73/38 |
| 5,325,723 | A | * | 7/1994 | Meadows et al. ................. 73/794 |
| 5,435,187 | A | * | 7/1995 | Ewy et al. ........................ 73/856 |
| 5,666,052 | A | * | 9/1997 | Sata .............................. 324/248 |
| 6,927,371 | B1 | * | 8/2005 | Hargett et al. ................. 219/679 |
| 7,183,766 | B2 | * | 2/2007 | Ito et al. ........................ 324/248 |
| 2008/0074110 | A1 | | 3/2008 | Mito et al. |
| 2008/0258412 | A1 | | 10/2008 | Kesselgruber |
| 2009/0206683 | A1 | * | 8/2009 | Mead et al. ................. 310/12.31 |

FOREIGN PATENT DOCUMENTS

| | | |
|---|---|---|
| JP | 2006-119072 | 5/2006 |
| JP | 2006-336625 | 12/2006 |
| JP | 2008-82719 A | 4/2008 |
| JP | 2008-510116 A | 4/2008 |

\* cited by examiner

PISTON CYLINDER-TYPE HIGH-PRESSURE GENERATING DEVICE

TECHNICAL FIELD

The present invention relates to a piston cylinder-type high-pressure generating device for accurately performing magnetic measurement under high pressure.

BACKGROUND ART

Conventionally, magnetic measurement in studies of physical properties has been performed with two parameters; i.e., temperature and magnetic field. However, in recent years, more and more active studies have been performed on physical properties in which, through introduction of pressure as a new parameter, magnetic functionally is investigated in a complex, extreme environment; i.e., high magnetic field, very low temperature, and high pressure.

FIG. 4 is a view showing a typical piston cylinder-type high-pressure generating device. A sample, and a liquid pressure medium for transmitting pressure to the sample and maintaining hydrostatic pressure acting thereon are enclosed in a capsule, and the capsule is disposed in a pressure chamber formed between a pair of pistons disposed to face each other. A pair of piston bearers are axially positioned by means of clamp nuts engaged with opposite end portions of a cylinder portion. Pressure is applied to the pair of piston bearers by use of, for example, oil pressure applied through center openings of the clamp nuts. The piston bearers transmit the pressure to the pressure chamber, in which the capsule is disposed, via the pistons.

Since the high-pressure generating device is used in a wide temperature range from cryogenic temperature to room temperature, the high-pressure generating device must be excellent in heat conductively. Furthermore, in order to allow detection of a very weak magnetic signal of a measurement sample, the high-pressure generating device must be formed of a non-magnetic material. Therefore, the material used to fabricate the high-pressure generating device is limited to alloys (CuBe, CuTi) containing copper as a main component. In consideration of measurement by use of a superconductive quantum interference device (SQUID) flux meter, which is used globally, the outer diameter of the cylindrical high-pressure generating device must be 8.6 mm or less. Moreover, in order to enable measurement of a sample, such as an antiferromagnetic substance, which exhibits a weak magnetic response only, the high-pressure generating device must secure an effective sample space of about 10 $mm^3$.

FIG. 5 is a view used for describing measurement by making use of a superconductive quantum interference device (SQUID) flux meter (see Patent Document 1). A change in magnetic flux detected by a superconductive pickup coil is detected via a superconductive quantum interference device SQUID, which serves as a transformer. An AC coil for generating an alternating magnetic field is provided outside the superconductive pickup coil, and a magnet for generating an external magnetic field is provided outside the AC coil so as to generate a stable magnetic field and provide a magnetic shield. An object of this magnet is to provide an enhanced magnetic shield function and a very stable steady magnetic filed, to thereby enable reduction of influence of magnetic noise by means of hardware. A sample whose magnetization is to be measured is located in the vicinity of the superconductive pickup coil. The superconductive pickup coil, the superconductive quantum interference device SQUID, and the external magnetic field generating magnet are cooled to a superconductive state by a refrigerator.

The magnetization of the sample is measured through DC measurement or AC measurement. In the DC measurement, the sample is moved over a distance of about 4 cm, from a position about 6 mm below the lowest coil portion of the detection coil dividedly wound to have three coil portions, to a position about 6 mm above the highest coil portion thereof, and the position dependency of an output voltage signal at that time is analyzed. In AC measurement, Fourier analysis is performed on the difference between an output voltage signal obtained at a position about 6 mm below the lowest coil portion and that obtained at the position of the center coil portion. In either measurement method, since the sample moves through the detection coil system, the entire structure of the high-pressure generating device is strongly desired to be formed of the same material.

In the case where the entire device is formed of copper beryllium (CuBe) under such a restriction, the device can generate only a relatively low pressure of 8 to 9 kbar. In the case where piston portions which transmit load to the sample are formed of hard ceramic, through use of a worm-gear-type pressurizing device, the maximum generation pressure reaches 15 kbar (see Non-patent Document 1). However, sensitivity of magnetic measurement lowers.

Also, conventionally, a support jig for preventing expansion of a cylinder portion has been indispensable. The diameter ratio of the cylinder portion (the ratio of the outer diameter to the inner diameter) is, for example, 8.50/2.60=3.27. Therefore, in order to generate a high pressure exceeding 10 kbar, a support jig for preventing expansion of the cell is essential, and only a system in which a pressurizing device is integrated with such a high-pressure generating device can generate a pressure up to 15 kbar.

Under such circumstances, there has been long awaited the appearance of a device in which the mechanical strength of CuBe is maximally utilized so as to enable the entire device to be formed of CuBe, and which can generate a pressure higher than 15 kbar, while maintaining satisfactory magnetic detection accuracy. Also, since the exemplified device has a cylinder length of 80 mm, which is very long as compared with its internal diameter of 2.6 mm, an operation of inserting a sample-enclosing capsule is difficult.

PRIOR ART DOCUMENT

Patent Document

Patent Document 1: Japanese Patent Application Laid-Open (kokai) No. 2008-82719

Non-Patent Document

Non-patent Document 1: M. Mito, "Magnetic measurements on molecule-based magnets under high pressure," Journal of the Physical Society of Japan, 76 (2007) Supplement A. pp. 182-185.

SUMMARY OF THE INVENTION

Problems to be Solved by the Invention

An object of the present invention is to solve the above-described problem, and to provide a piston cylinder-type high-pressure generating device in which a cylinder having a small outer diameter (8.6 mm) is formed of a non-magnetic material (CuBe) and which can generate a high pressure (15 kbar or higher) while securing a sample space having a predetermined effective volume (e.g., 10 mm$^3$).

Another object of the present invention is to construct a portable system which can increase pressure without use of a large size pressurizing device (a hydraulic press or a worm-gear-type pressurizing device).

Still another of the present invention is to facilitate an operation of inserting a sample-enclosing capsule.

Means for Solving the Problems

A piston cylinder-type high-pressure generating device of the present invention comprises a cylinder portion formed of a non-magnetic material. This cylinder portion is divided into a cylinder main body, and two side cylinders coupled to opposite ends of the cylinder main body. The cylinder main body is configured so that a sample-enclosing capsule in which a sample and a pressure medium are enclosed can be disposed inside the cylinder main body. Pistons for load transmission are disposed at opposite ends of the interior of the cylinder portion; and locking nuts are provided on the outer sides of the positions. The pistons are moved in an axial direction by screwing the locking nuts.

The locking nuts move the pistons in the axial direction via piston bearers which are movable within the side cylinders. The cylinder portion and the pistons may be formed of copper beryllium (CuBe). Each of the locking nuts has a bearing mechanism incorporated therein. The diameter ratio of the cylinder portion between the outer and inner diameters thereof falls within a range of 3.3 to 5.1 inclusive. The diameter of each piston is gradually increased at its root portion.

The sample-enclosing capsule is configured by placing a sample and a pressure medium into a cylindrical tube formed of Teflon (registered trademark) tetrafluoride, and sealing opposite ends of the cylindrical tube by use of caps formed of Teflon trifluoride.

Effects of the Invention

Physicists who are not specialized in high pressure magnetic measurement can readily perform accurate magnetic measurement in a pressure range above 10 kbar, into which only specialists in a high pressure field have stepped into.

Since a large pressurizing device is not needed, initial cost at the time of introduction of the device can be reduced greatly, whereby the spread of high pressure measurement is expected to be promoted.

Since a large pressurizing device is not needed, a set including the device can be readily carried. For researchers who have utilized a SQUID flux meter through shared use of a large research facility or the like, a hurdle of purchasing the device becomes lower, and the researchers can readily undertake high pressure magnetic measurement.

MODE FOR CARRYING OUT THE INVENTION

Figure 1:
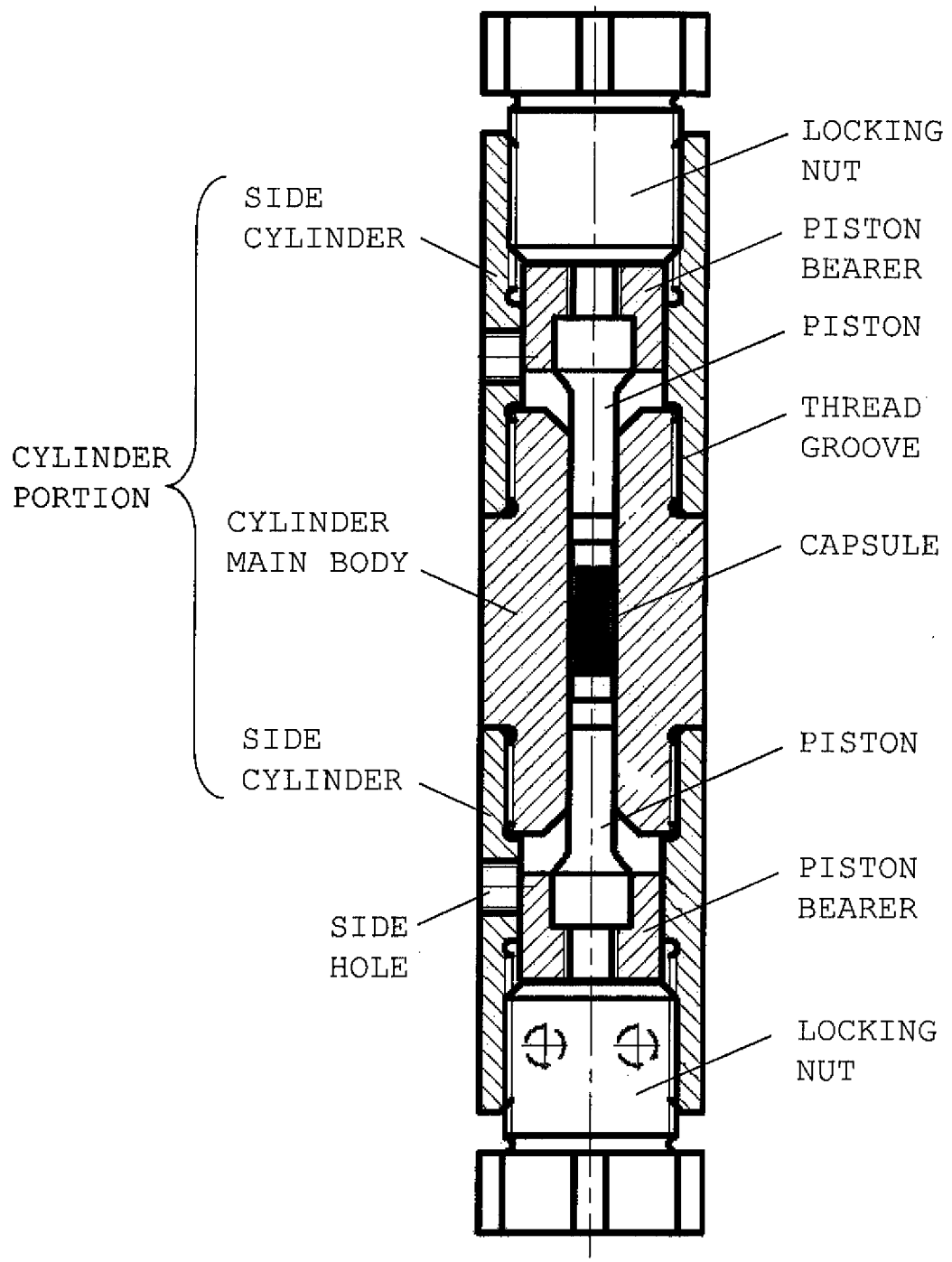
FIG. 1 is a view exemplifying a piston cylinder-type high-pressure generating device configured in accordance with the present invention.

The present invention will now be described by way of example. FIG. 1 is a view exemplifying a piston cylinder-type high-pressure generating device configured in accordance with the present invention. A cylinder portion exemplified here is divided into three pieces; i.e., a cylinder main body, and two side cylinders which are integrally coupled to opposite ends of the cylinder main body by means of, for example, screw fixing. Side holes are provided in the side cylinders, and round bars are screwed into the side holes so as to easily rotate the side cylinders. Furthermore, lead wires may be extended from the side holes so as to measure electrical resistance. This divided structure facilitates not only setting operation, in particular, operation of inserting a sample-enclosing capsule, but also disassembly operation such as removal of pistons. Furthermore, the divided structure facilitates manufacture and machining of various portions of the cylinder (in particular, a piston introduction space at the center portion of the cylinder, and a tapered portion at the entrance of the space).

Copper beryllium (CuBe) is most suitable for the cylinder portion, because copper beryllium does not hinder measurement of magnetic properties, provides adequate mechanical strength, and is excellent in heat conductivity, which enables the high-pressure generating device to be used in low-temperature experiments. Since pistons are required not to hinder measurement of magnetic properties and to have adequate compressive strength (stiffness) and breakage resistance (buckling strength), copper beryllium (CuBe) is most suitable for the pistons. However, zirconia may be used for the pistons.

The setting procedure of the high-pressure generating device is as follows.

(1) A sample, a pressure medium, and a substance (in general, a superconductor such as lead) for pressure test (when necessary) are enclosed in a sample-enclosing capsule.

(2) This sample-enclosing capsule is inserted into the cylinder main body.

(3) Pistons for load transmission are set at opposite ends of the interior of the cylinder main body.

(4) The side cylinders at opposite ends of the cylinder portions are screwed into the cylinder main body and set. Specifically, thread groves are formed on the outer circumferential surfaces of opposite end portions of the cylinder main body, and on the inner circumferential surfaces of the side cylinder to be screw-engaged with the outer circumferential surfaces of the opposite end portions of the cylinder main body. The side cylinders are screwed onto the cylinder main body, while being rotated in relation to the cylinder main body. Although the cylinder main body has a diameter equal to that of the side cylinder, the inner diameter of the side cylinders is larger than that of the cylinder main body.

(5) Locking nuts are set at the opposite ends of the pistons via respective piston bearers. The piston bearers, which are movable in the axial direction, are situated inside the respective side cylinders, and have shapes suitable for bearing end portions of the pistons. By means of rotating the locking nuts at the opposite ends, the piston bearers can be moved toward the center with respect to the axial direction, whereby a pressure can be applied to a pressure space in which the capsule has been set. Furthermore, by mean of rotating the locking nuts so that they move in the same direction, the capsule can be moved in the axial direction while the high pressure is maintained.

Figure 2A:
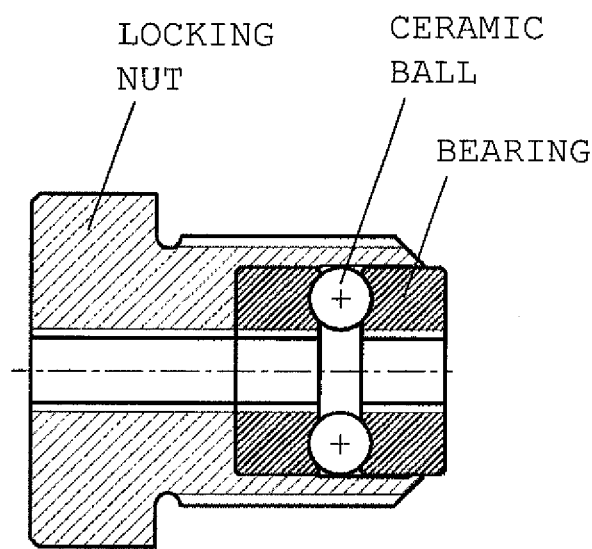
FIGS. 2(A) and 2(B) are an enlarged cross-sectional view and a side view, respectively, of a locking nut.
Figure 2B:
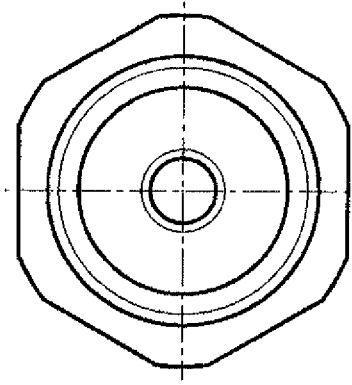

FIGS. 2(A) and 2(B) are an enlarged cross-sectional view and a side view, respectively, of a locking nut. The high-pressure generating device is configured such that, by means of rotating each locking nut by use of a spanner, each locking nut can be caused to advance along the thread groove formed on the inner circumferential surface of the corresponding side cylinder, to thereby move the corresponding piston in the axial direction. Thus, a high pressure exceeding 15 kbar can be generated. In order to reduce friction to thereby allow smooth movement of the pistons, use of a bearing-incorporated locking nut as shown in FIG. 2 is desirable. The illustrated locking nut has a bearing recess on the distal end side thereof, and a bearing is accommodated within the bearing recess. A plurality of (e.g., four) ceramic balls are disposed along the outer circumferential surface of the bearing in order to reduce friction between the bearing and the wall surface of the recess of the locking nut. Copper beryllium (CuBe) may be used for the locking nut and the bearing. Although silicon nitride ($Si_3N_4$) is desirably used for the ceramic balls, zirconia ($ZrO_2$) may be used. When a locking nut is screwed, such a bearing enables the corresponding piston to smoothly move along a concentric axis without rotating. Thus, a pressure can be effectively generated before it exceeds a breakage limit of the piston (CuBe) having a small diameter.

As in a conventional device, there can be used a pressurizing device which applies a pressure hydraulically via a hole provided at the center of each nut as shown in FIG. 2. However, the high-pressure generating device shown in FIG. 1 can generate a pressure up to 15 kbar through tightening the nuts, without use of such a pressurizing device. Desirably, the pressurizing device is omitted in order to reduce introduction cost of the device and make the device portable.

In the case of the illustrated high-pressure generating device, by means of designing the cylinder main body to have a large diameter ratio (8.50/1.70=5.00) between the outer and inner diameters thereof, a mechanism for preventing expansion of the cylinder portion becomes unnecessary. Preferably, the cylinder main body has a diameter ratio which falls within a range of 3.3 to 5.1 inclusive, because, when the diameter ratio of the cylinder main body falls within this range, 15 kbar can be realized without causing breakage of the cylinder main body. The reason for decreasing the piston diameter (the inner diameter of the cylinder main body) is to increase the hydrostatic pressure within the small capsule with a limited force.

When each locking nut is screwed, due to frictional resistance between the locking nut and the corresponding piston and piston bearer, a force in the rotational direction (twisting force) acts thereon. Therefore, when the diameter of the piston is small, breakage, such as buckling, may occur. Through employment of locking nuts each having a bearing mechanism, stress in a direction perpendicular to the direction of load can be reduced greatly, whereby the inner diameter of the cylinder main body can be reduced. Furthermore, since the cylinder portion is divided into three pieces, an optimal piston can be realized. A decrease in strength of each piston attributable to the reduced outer diameter thereof can be compensated by means of gradually increasing the diameter of each piston at a root portion thereof.

Presumably, the illustrated high-pressure generating device is used not only by physicists, but also by chemists. Therefore, various substances, from a structurally soft substance to a structurally hard substance, are measured. In the case of a structurally soft substance (organic substance), in order to pursue its essential pressure effect, an isotropic pressure (hydrostatic pressure) must be applied, and a pressure transmission medium softer than the substance to be measured is needed. In general, in order to avoid reaction between the pressure transmission medium and a sample, inert fluorine oil (e.g., Fluorinert) is often used. However, since such inert fluorine oil is highly volatile, a tightly sealed capsule for enclosing a medium and a sample becomes necessary.

Figure 3:
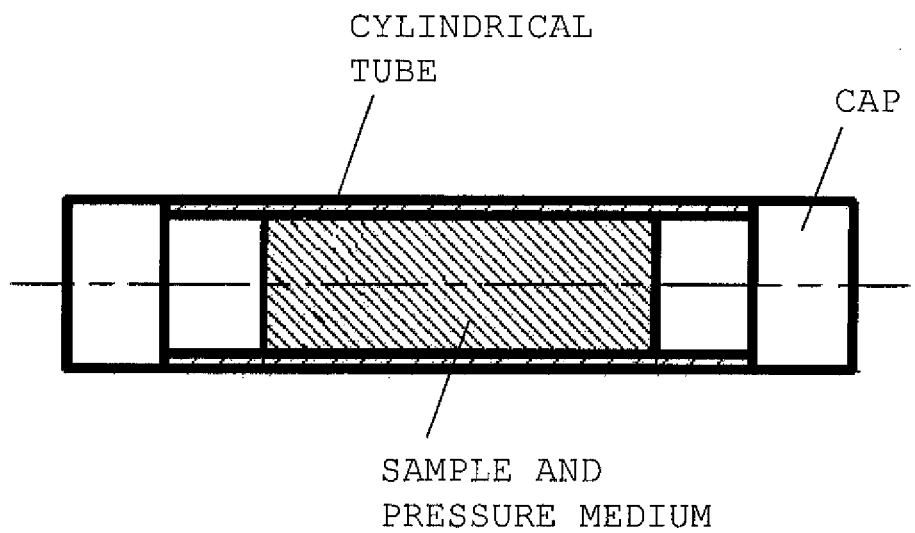
FIG. 3 is an enlarged cross-sectional view showing a sample-enclosing capsule.
Figure 4:
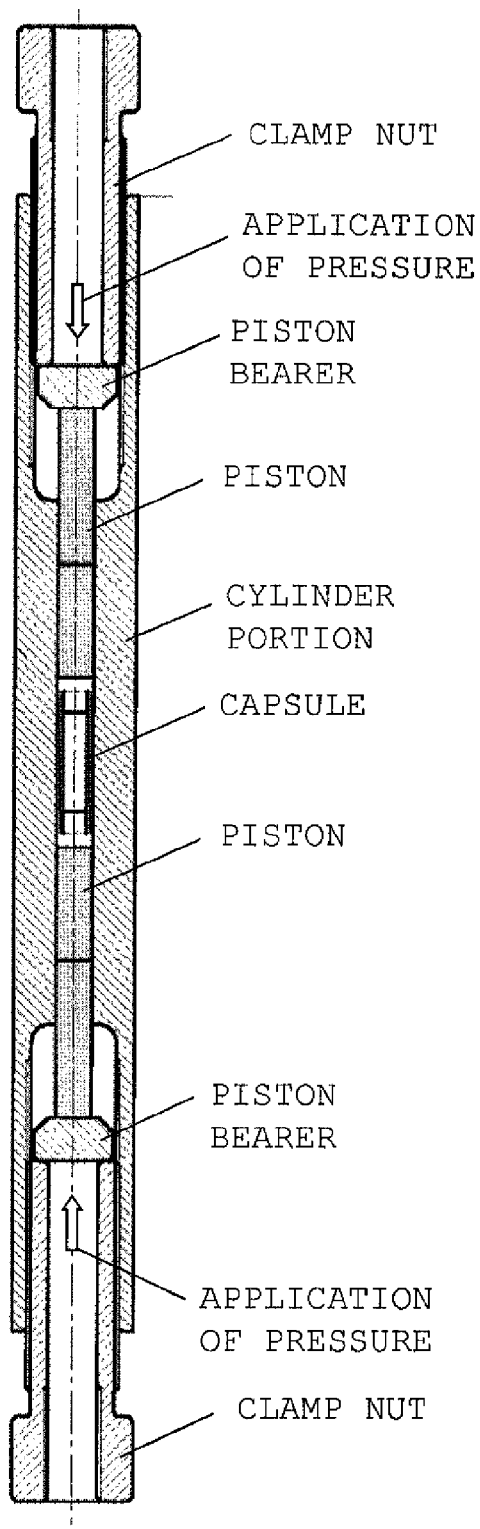
FIG. 4 is a view showing a general piston cylinder-type high-pressure generating device.
Figure 5:
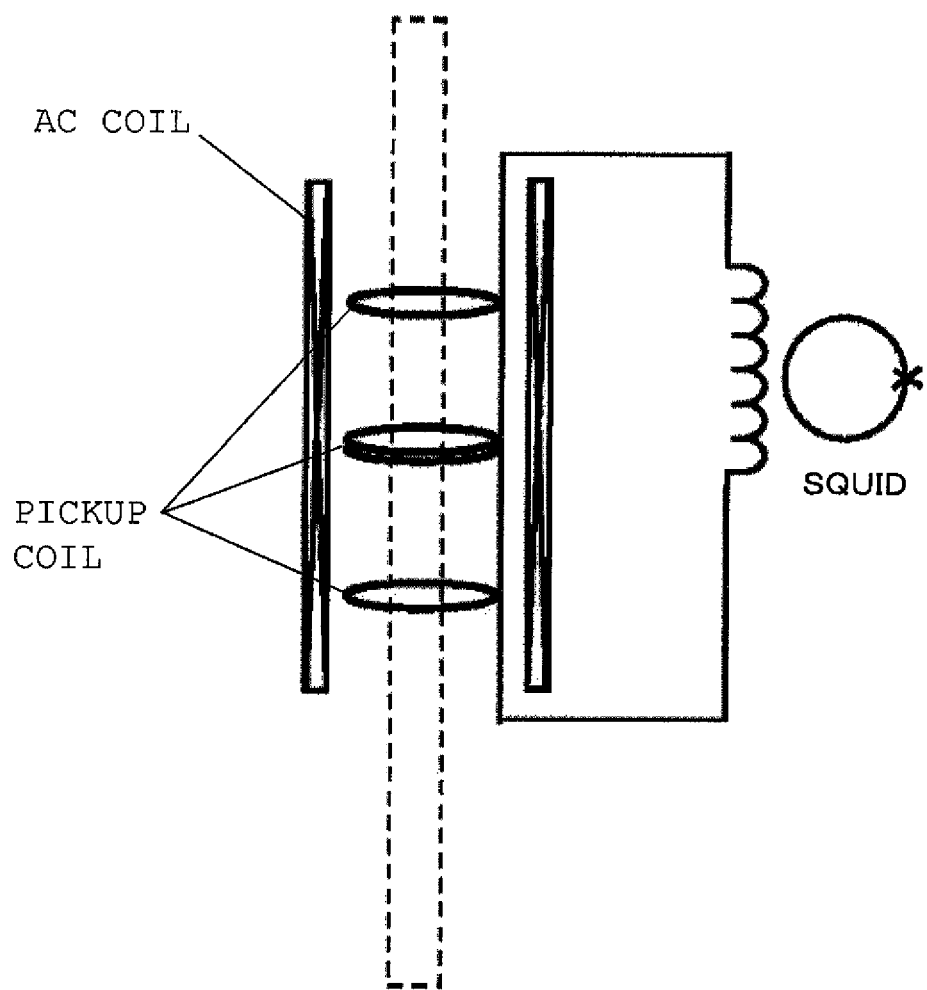
FIG. 5 is a view used for describing measurement by making use of a superconductive quantum interference device (SQUID) flux meter.

FIG. 3 is an enlarged cross-sectional view of a sample-enclosing capsule. The illustrated capsule is configured by placing a sample and a pressure medium within a cylindrical tube, and sealing it from the opposite ends by use of caps. In order to realize hydrostatic pressurization, the material of the tube must be flexible. Further, in order to facilitate enclosure of a sample and a medium and confirm that no air bubbles are present, the tube must be formed of a transparent plastic. Of transparent plastics, tetrafluoroethylene (Teflon tetrafluoride) is most suitable. For the material of the caps, Teflon trifluoride, which is harder than the tube, is most suitable.

Although the inner diameter of the cylinder main body is reduced, through an increase in the strength of the sample-enclosing capsule, a reduction of the effective sample space can be prevented, while the pressure-receiving area of the sample-enclosing capsule is made small. This prevents leakage of the pressure medium, and enables reuse of the sample-enclosing capsule, which has been conventionally discarded.

A requirement common for the materials of all the components of the high-pressure generating device, such as the sample-enclosing capsule, the cylinder, and the pistons, is to be a material which does not hinder measurement of magnetic properties. The reason for forming the sample-enclosing capsule from Teflon tetrafluoride or Teflon trifluoride is that the capsule must be formed of a material which does not hinder measurement of magnetic properties, and which has elasticity so that, when the caps attached to the opposite ends are pressed inward in order to increase the pressure within the capsule (apply hydrostatic pressure (spatially isotropic pressure) to a sample within a liquid medium), the capsule contracts in the length direction thereof.

Although only a few exemplary embodiments of the present invention have been described in detail above, many modifications are possible in the exemplary embodiments without materially departing from the novel teachings and advantageous effects of the invention.

The invention claimed is:

1. A piston cylinder-type high-pressure generating device for use in a squid flux meter comprising:
   a cylinder portion formed of a non-magnetic material, wherein:
   the cylinder portion is divided into a cylinder main body, and two side cylinders coupled to opposite ends of the cylinder main body;
   the cylinder main body is configured so that a sample-enclosing capsule in which a sample and a pressure medium are enclosed can be disposed inside the cylinder main body; and
   pistons for load transmission are respectively disposed at opposite ends of the interior of the cylinder portion, and locking nuts are provided on the outer sides of the pistons, one side of each of said two side cylinders being coupled to said cylinder main body, another side of each of said two side cylinders having a threaded groove, one of said locking nuts being set inside said threaded groove of one of said two side cylinders and another one of said locking nuts being set inside said threaded groove of another one of said two side cylinders;
   a plurality of ceramic balls are disposed along an outer circumferential surface of a bearing and a wall surface of a recess of each of the locking nuts; and the pistons are moved toward the center with respect to an axial direction by screwing the locking nuts, to thereby apply a pressure to a pressure space in which the sample-enclosing capsule is set, and the sample-enclosing capsule is moved in the axial direction by rotating the locking nuts so that said locking nuts move in the same direction.

2. A high-pressure generating device according to claim 1, wherein the locking nuts move the pistons in the axial direction via piston bearers which are movable within the side cylinders.

3. A high-pressure generating device according to claim 1, wherein the cylinder portion and the pistons are formed of copper beryllium (CuBe).

4. A high-pressure generating device according to claim 1, wherein the diameter ratio of the cylinder portion between the outer and inner diameters thereof falls within a range of 3.3 to 5.1 inclusive.

5. A high-pressure generating device according to claim 1, wherein the diameter of each piston is gradually increased at its root portion.

6. A high-pressure generating device according to claim 1, wherein the sample-enclosing capsule is configured by placing a sample and a pressure medium into a cylindrical tube formed of polytetrafluoroethylene (PTFE), and sealing opposite ends of the cylindrical tube by use of caps formed of polytetrafluoroethylene (PTFE).

7. A piston cylinder-type high-pressure generating device for use in a squid flux meter, the device comprising:
   a cylinder portion formed of a non-magnetic material, said cylinder portion comprising a cylinder main body and two side cylinders, one of said two side cylinders being connected to one end of said cylinder main body, another one of said two side cylinders being connected to another end of said cylinder main body, said one end being opposite said another end;
   a sample;
   a pressure medium;
   a sample-enclosing capsule, said sample and said pressure medium being disposed in said sample-enclosing capsule, said sample-enclosing capsule being disposed in a pressure space defined by said cylinder main body;
   a plurality of pistons for load transmission, one of said pistons being disposed at one end portion of an interior of said cylinder portion and another one of said pistons being disposed at another end portion of the interior of said cylinder portion, said one end portion being opposite said another end portion;
   a plurality of locking nuts, one of said locking nuts being provided on one outer side of one of said pistons and another one of said locking nuts being provided on another outer side of another one of said pistons, wherein one side of each of said two side cylinders is coupled to said cylinder main body and another side of each of said two side cylinders has a threaded groove, said threaded groove of said one of said two side cylinders receiving at least a portion of one of said locking nuts, said threaded groove of said another one of said two side cylinders receiving at least a portion of another one of said locking nuts, said locking nuts being movably mounted such that said locking nuts move in a direction of said sample-enclosing capsule and said pistons move toward a center of said cylinder main body with respect to an axial direction based on movement of said locking nuts and said sample-enclosing capsule is moved in the axial direction based on movement of said locking nuts, wherein said pistons apply a pressure to said pressure space, each of said locking nuts comprising a plurality of ceramic balls disposed along an outer circumferential surface of a bearing and a wall surface of a recess of a respective locking nut.

8. A high-pressure generating device according to claim 7, wherein the locking nuts move the pistons in the axial direction via piston bearers which are movable within the side cylinders, said one of said locking nuts and said one of said pistons applying a first force to said sample-enclosing capsule in a first direction of said sample-enclosing capsule, said another one of said locking nuts and said another one of said pistons applying a second force to said sample-enclosing capsule in a second direction of said sample-enclosing capsule, said first direction being opposite said second direction.

9. A high-pressure generating device according to claim 7, wherein the cylinder portion and the pistons are formed of copper beryllium (CuBe).

10. A high-pressure generating device according to claim 7, wherein the diameter ratio of the cylinder portion between the outer and inner diameters thereof falls within a range of 3.3 to 5.1 inclusive.

11. A high-pressure generating device according to claim 7, wherein the diameter of each piston is gradually increased at its root portion.

12. A high-pressure generating device according to claim 7, wherein the sample-enclosing capsule is configured by placing the sample and the pressure medium into a cylindrical tube formed of polytetrafluoroethylene (PTFE), and sealing opposite ends of the cylindrical tube by use of caps formed of polytetrafluoroethylene (PTFE).

13. A piston cylinder-type high-pressure generating device for use in a squid flux meter, the device comprising:
   a cylinder portion formed of a non-magnetic material, said cylinder portion comprising a cylinder main body, a first side cylinder and a second side cylinder, said first side cylinder having a first side cylinder first end portion and a first side cylinder second end portion comprising a first side cylinder threaded groove, said first side cylinder first end portion engaging one end portion of said cylinder main body, said second side cylinder comprising a second side cylinder first end portion and a second side cylinder second end portion comprising a second side cylinder threaded groove, said second side cylinder first end portion engaging another end portion of said cylinder main body, said one end portion being opposite said another end portion;
   a sample;
   a pressure medium;
   a sample-enclosing capsule, said sample and said pressure medium being disposed in said sample-enclosing capsule, said sample-enclosing capsule being disposed in a pressure space defined by said cylinder main body;
   a first piston arranged in an interior of said cylinder portion, adjacent to said one end portion of said cylinder main body;
   a second piston arranged in the interior of said cylinder portion, adjacent to said another end portion of said cylinder main portion;
   a first locking nut engaging said first side cylinder second end portion, wherein at least a portion of said first locking nut is located in said first side cylinder threaded groove, said first locking nut being located opposite said first piston, said first locking nut being movably mounted to said first side cylinder via said first side cylinder threaded groove such that said first locking nut moves in a direction of said sample-enclosing capsule and said first piston moves toward a center of said cylinder main body with respect to an axial direction based on movement of said first locking nut and said sample-enclosing capsule moves in the axial direction based on movement of said first locking nut, said first locking nut comprising a plurality of ceramic balls disposed along an outer circumferential surface of a bearing and a wall surface of a recess of the first locking nut;

a second locking nut engaging said second side cylinder second end portion, wherein at least a portion of said second locking nut is located in said second side cylinder threaded groove, said second locking nut being located opposite said second piston, said second locking nut being movably mounted to said second side cylinder via said second side cylinder threaded groove such that said second locking nut moves in the direction of said sample-enclosing capsule and said second piston moves toward the center of said cylinder main body with respect to the axial direction based on movement of said second locking nut and said sample-enclosing capsule moves in the axial direction based on movement of said second locking nut, wherein a pressure is set in said pressure space via said first locking nut, said first piston, said second locking nut and said second piston, said second locking nut comprising a plurality of ceramic balls disposed along an outer circumferential surface of a bearing and a wall surface of a recess of the second locking nut.

14. A high-pressure generating device according to claim 13, wherein the first locking nut moves the first piston in the axial direction via a first piston bearer and the second locking nut moves the second piston in the axial direction via a second piston bearer, said first piston bearer engaging said first locking nut and said first piston, said first piston bearer being movable in said first side cylinder, said second piston bearer being movable in said second side cylinder, said second piston bearer engaging said second locking nut and said second piston.

15. A high-pressure generating device according to claim 13, wherein the cylinder portion and the first piston and the second piston are formed of copper beryllium (CuBe).

16. A high-pressure generating device according to claim 13, wherein said first piston has a first piston first end portion and a first piston second end portion, said first piston first end portion being located in said cylinder main body, said first piston second end portion being located in said first side cylinder at a spaced location from said one end portion of said cylinder main body, said second piston having a second piston first end portion and a second piston second end portion, said second piston first end portion being located in said cylinder main body, said second piston second end portion being located in said second side cylinder at a spaced location from said another end portion of said cylinder main body.

17. A high-pressure generating device according to claim 13, wherein the diameter ratio of the cylinder portion between outer and inner diameters thereof falls within a range of 3.3 to 5.1 inclusive.

18. A high-pressure generating device according to claim 13, wherein a diameter of each of said first piston and said second piston is gradually increased at a root portion thereof.

* * * * *